United States Patent [19]
Gardner et al.

[11] Patent Number: 5,600,754
[45] Date of Patent: Feb. 4, 1997

[54] METHOD AND SYSTEM FOR THE ARRANGEMENT OF VOCODER DATA FOR THE MASKING OF TRANSMISSION CHANNEL INDUCED ERRORS

[75] Inventors: William R. Gardner, Encinitas; Paul E. Jacobs, San Diego, both of Calif.

[73] Assignee: Qualcomm Incorporated, San Diego, Calif.

[21] Appl. No.: 194,824

[22] Filed: Feb. 14, 1994

Related U.S. Application Data

[63] Continuation of Ser. No. 826,701, Jan. 28, 1992, abandoned.

[51] Int. Cl.⁶ .......................................... G01L 9/00
[52] U.S. Cl. ............................ 395/2.3; 395/2.33
[58] Field of Search .................... 395/2.3, 2.31, 395/2.33

[56] References Cited

U.S. PATENT DOCUMENTS

| 4,617,676 | 10/1986 | Jayant et al. | 381/30 |
| 4,726,037 | 2/1988 | Jayant | 381/30 |
| 4,903,301 | 2/1990 | Kondo et al. | 381/31 |
| 4,922,537 | 5/1990 | Frederiksen | 381/31 |
| 5,414,796 | 5/1996 | Jacobs et al. | 395/2.3 |

*Primary Examiner*—Allen R. MacDonald
*Assistant Examiner*—Vijay B. Chawan
*Attorney, Agent, or Firm*—Russell B. Miller; Sean English

[57] ABSTRACT

A method and system by which parameter data representative of vocoded speech are organized into a data packet for transmission so as to reduce the impact of transmission channel induced errors on the data packet. A data packet is constructed with certain most perceptually significant bits of parameter data at the beginning of the data packet. Following in the data packet are lesser perceptually significant bits of the same parameter data. Other parameter data then follows in the data packet. Interleaved in the data packet following the most perceptually significant bits at the beginning of the data packet are most perceptually significant bits of other parameter data. A parity check code is computed from the most perceptually significant bits in the data packet and also interleaved in the data packet following the most perceptually significant bits at the beginning of the data packet.

36 Claims, 5 Drawing Sheets

FULL RATE

| | | | | | | | | |
|---|---|---|---|---|---|---|---|---|
| LPC | 40 ||||||||
| PITCH | 10 || 10 || 10 || 10 ||
| CODEBOOK | 10 | 10 | 10 | 10 | 10 | 10 | 10 | 10 |

TOTAL = 160 (PLUS 11 PCB)

FIG. 2a

HALF RATE

| | | | | |
|---|---|---|---|---|
| LPC | 20 ||||
| PITCH | 10 || 10 ||
| CODEBOOK | 10 | 10 | 10 | 10 |

TOTAL = 80

FIG. 2b

QUARTER RATE

| | | |
|---|---|---|
| LPC | 10 ||
| PITCH | 10 ||
| CODEBOOK | 10 | 10 |

TOTAL = 40

FIG. 2c

EIGHTH RATE

| | |
|---|---|
| LPC | 10 |
| PITCH | 0 |
| CODEBOOK | 6 |

TOTAL = 16

FIG. 2d

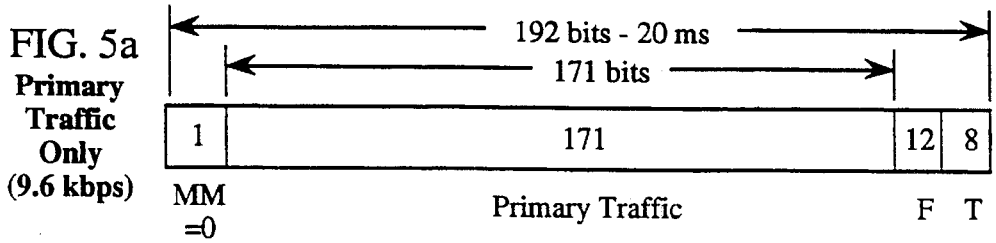

FIG. 5a Primary Traffic Only (9.6 kbps)

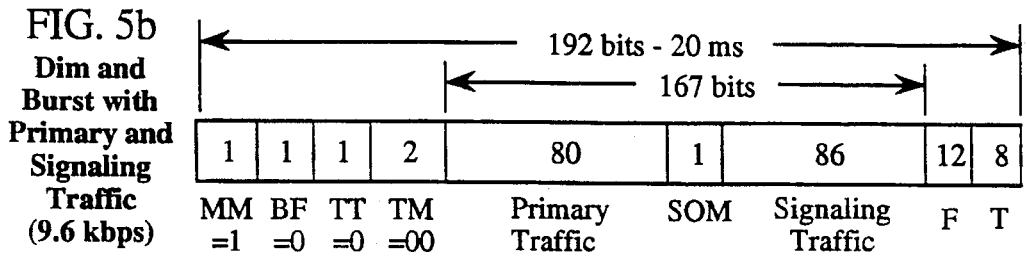

FIG. 5b Dim and Burst with Primary and Signaling Traffic (9.6 kbps)

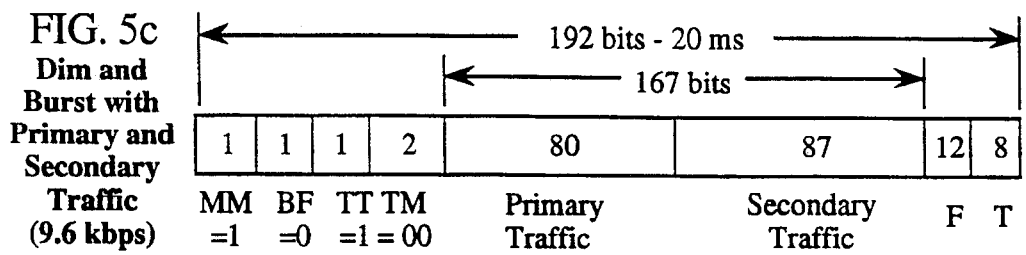

FIG. 5c Dim and Burst with Primary and Secondary Traffic (9.6 kbps)

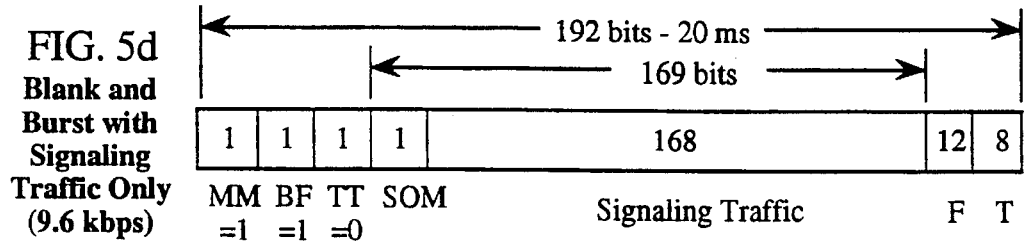

FIG. 5d Blank and Burst with Signaling Traffic Only (9.6 kbps)

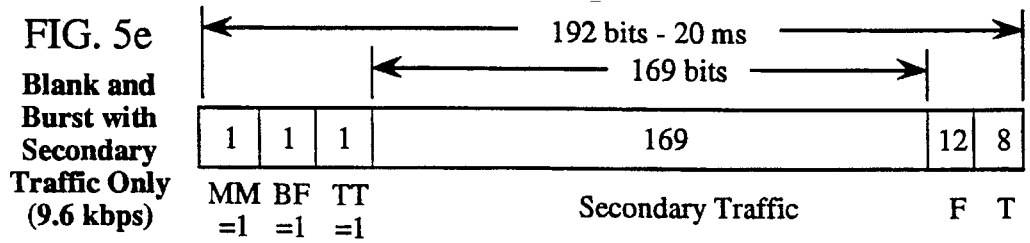

FIG. 5e Blank and Burst with Secondary Traffic Only (9.6 kbps)

Notation

MM - Mixed Mode Bit
  0 - Primary Traffic Only
  1 - Primary Traffic and/or
    Signaling/Secondary Traffic
BF - Burst Format Bit
  0 - Dim-and-burst
  1 - Blank-and-burst
TT - Traffic Type Bit
  0 - Signaling
  1 - Secondary TM - Traffic Mode Bits
  00 - 80 Primary Traffic Bits,
    87 Signaling or Secondary Traffic Bits
  01, 10, and 11 - Reserved
SOM - Start of Message Bit
  0 - Message does not begin at the following bit
  1 - Message begins at the following bit
F - Frame Quality Indicator (CRC)
T - Encoder Tail Bits 4.8 kbps
Frame
Format 2.4 kbps
Frame
Format 1.2 kbps
Frame
Format Notation F - Frame Quality Indicator (CRC)
T - Encoder Tail Bits

METHOD AND SYSTEM FOR THE ARRANGEMENT OF VOCODER DATA FOR THE MASKING OF TRANSMISSION CHANNEL INDUCED ERRORS

This is a continuation of application Ser. No. 07/826,701, filed Jan. 28, 1992 now abandoned.

BACKGROUND OF THE INVENTION

I. Field of the Invention

The present invention relates to the organization of data for transmission. More particularly, the present invention relates to a novel and improved method and system for the packing of variable rate vocoder generated data into data packets for transmission, and for the unpacking of received variable vocoder data packets for speech reconstruction.

II. Description of the Related Art

In the field of digital communications various arrangements of digital data for transmission are used. The data bits are commonly organized into data packets for transfer over the communication medium. In the case of data generated by a vocoder, the data is also organized for transmission.

Generally in the preparation of a data packet for transmission over a communication channel some form of forward error correction encoding may be used to protect the data from transmission channel induced errors. In the event that channel errors do occur in the error correction encoded data, in many instances the errors may be detected and corrected.

While error correction techniques do provide a valuable method for reducing channel errors, such techniques alone may not sufficiently provide the level of protection necessary. In the case where portions of the data packet are of significantly greater importance than others, it is desirable to provide further forms of protection from channel errors. An example of such a case is where the data packet contains vocoder data where certain parameters are of greater significance in reconstruction of the speech data therefrom.

It is therefor an object of the present invention to provide in communication of digital information further protection of more significant portions of the information from channel induced errors.

SUMMARY OF THE INVENTION

The present invention is a novel and improved method and apparatus for organizing vocoder output data representative of vocoded speech into data packets for transmission, and extracting from the received data packets the data for input to the vocoder for reconstruction into speech.

In Code Division Multiple Access (CDMA) communications, as in all digital communications systems, transmission channel conditions may induce errors into the digital data as it is communicated over the transmission medium. Error correction coding techniques, along with power control techniques, can reduce channel errors. However there are limitations to each of these techniques which can result in less than optimum system performance.

For example, in the CDMA system an increase in transmitter power can reduce susceptibility to channel errors. However increases in transmitter power presents an adverse impact on system capacity. In the CDMA system each user's signal appears as interference to others. There is also a limit on the total noise in the system to which the signal processing gain of a CDMA receiver can still extract its intended signal from the noise. Total channel interference caused by the users is thus a function of the number of users and the power at which they are transmitting. As the signal power of a user's transmitter increases, the signal to noise ratio of the intended user receiver improves. However this particular user's increase in signal power serves as an increase in interference to unintended recipient user receivers. As such there is a decrease in signal to noise ratio, with a greater reliance on processing gain to extract these users signals which may result in a degradation in performance. Therefore although increases in transmitter power can provide a reduction in susceptibility to channel induced errors, system capacity factors limit its usage.

The present invention implements a data format scheme that improves the reliability of the data by masking some of the CDMA transmission channel errors. In the variable rate vocoder, speech is generally encoded at the highest rate to achieve the highest quality of sound upon reconstruction. However, pauses in speech and background noise are less important and may be encoded at a lower rate. In data encoded at the highest encoding rate it is particularly important to provide a high level of protection on the data to ensure that upon reception decoding reliable data is used. In data encoded at the highest encoding rate, certain parameter data, in particular certain bits of this parameter data, representative of the encoded speech are of greater significance than others. The present invention recognizes the effect of CDMA channel errors on transmitted data, and provides a data format which reduces the impact of the channel errors on the more significant data portions.

The present invention discloses a method and system by which certain parameter data and certain bits of the parameter data are organized to mask channel errors. In accordance with the present invention it is realized that data which is transmitted first in a transmission data packet is less susceptible to CDMA channel errors. When such errors occur, they generally occur in a short burst, typically a length of eight or less bits for the preferred full rate frame rate. Another error condition occurs when the receiver cannot correctly make a rate decision for the received frame of vocoder data. However in this case the vocoder may be given a packet of random bits. The present invention provides a scheme for distinguishing between these two cases.

In the present invention a data packet is organized with some of the most perceptually significant bits of vocoder parameter data placed at the beginning of the data packet while the remainder of the most perceptually significant bits of vocoder parameter data are interleaved throughout the rest of the packet. Error correcting bits are computed from the most perceptually significant bits of vocoder parameter data and are also interleaved throughout the packet. With a high probability, the single error correcting code now allows a distinction to be made for a received data packet between one of a short burst of errors and one of many errors throughout the frame. In this way, a data packet with a few errors can be used successfully, with the most perceptually significant bits of vocoder parameter data being correct. However a data packet with many errors can be identified and ignored.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIGS. 2a–2d are a series of charts illustrating the vocoder output parameter bit distribution for the various vocoder output data frame rates;

FIGS. 5a–5h are a series of charts illustrating the arrangement of data packets within the the transmission packets for various transmission modes and vocoder frame rates.

DETAILED DESCRIPTION OF THE PREFERRED EMBODIMENTS

Figure 1:
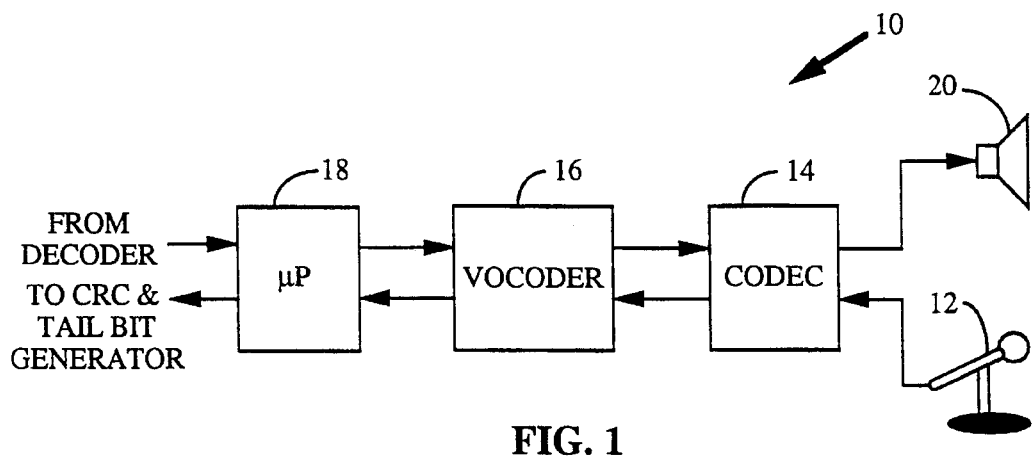
FIG. 1 is a block diagram of an exemplary vocoding system.

Referring to the figures, FIG. 1 illustrates in block diagram form an exemplary implementation of a vocoding system 10. It should be realized that FIG. 1 illustrates but one physical implementation such as in a mobile station. For the implementation in the environment of a Mobile Telephone Switching Office (MTSO) and cell base station in a cellular system, the elements of FIG. 1 may be physically separated as described below.

For digital communication of voice, sounds such as speech and/or background noise are sampled and digitized by well known techniques. For example, in FIG. 1, sound is converted by microphone 12 to an analog signal which is then be converted to a digital signal by codec 14. Codec 14 typically performs an analog to digital conversion process using a standard 8 bit/µlaw format. In the alternative, the analog signal may be directly converted to digital form in a uniform pulse code modulation (PCM) format. In an exemplary embodiment codec 14 uses an 8 kHz sampling and provides an output of 8 bit samples at the sampling rate so as to realize a 64 kbps data rate.

The 8 bit samples are output from codec 14 to vocoder 16 where a µlaw/uniform code conversion process is performed. In vocoder 16, the samples are organized into frames of input data wherein each frame is comprised of a predetermined number of samples. In a preferred implementation of vocoder 16 each frame is comprised of 160 samples or of 20 msec. of speech at the 8 kHz sampling rate. It should be understood that other sampling rates and frame sizes may be used. Each frame of speech samples is encoded by vocoder 16 with the resultant parameter data formatted into a corresponding data packet in accordance with the present invention as described herein. Vocoder 16 is preferrably configured as a variable rate vocoder which encodes each frame of speech samples at a rate dependent on speech activity and system operating conditions. The vocoder data packets are then output to microprocessor 18 for transmission formatting. Microprocessor 18 provides an output of the transmission formatted data to a transceiver (not shown) for modulation and transmission.

At the receiver the transmission formatted data packets are received and demodulated by the transceiver and then provided to microprocessor 18. In microprocessor 18 the transmission formatting is removed and the extracted data packet for each speech frame is output to vocoder 16. Vocoder 16 reconstructs from each data packet the samples of a corresponding speech frame. These reconstructed speech frame samples are output to codec 14 where conventionally decoded and converted to analog form. The analog speech samples are then output to speaker 20 where converted to an acoustical signal.

A preferred implementation of vocoder 16 utilizes a form of the Code Excited Linear Predictive (CELP) coding techniques so as to provide a variable rate in coded speech data. A Linear Predictive Coder (LPC) analysis is performed upon a constant number of samples, and the pitch and codebook searches are performed on varying numbers of samples depending upon the transmission rate. A variable rate vocoder of this type is described in further detail in copending U.S. patent application Ser. No. 07/713,661 filed Jun. 11, 1991, and assigned to the Assignee of the present invention. Vocoder 16 may be implemented in an application specific integrated circuit (ASIC) or in a digital signal processor.

In the variable rate vocoder just mentioned, the speech analysis frames are 20 msec. in length, implying that the extracted parameters are output in a burst 50 times per second. Furthermore the rate of data output is varied from roughly 8 kbps to 4 kbps to 2 kbps, and to 1 kbps.

At full rate, also referred to as rate 1, data transmission between the vocoder and the microprocessor is at an 8.55 kbps rate. For the full rate data the parameters are encoded for each frame and represented by 160 bits. The full rate data frame also includes a parity check of 11 bits thus resulting in a full rate frame being comprised of a total of 171 bits. In the full rate data frame, the transmission rate between the vocoder and the microprocessor absent the parity check bits would be 8 kbps.

At half rate, also referred to as rate ½, data transmission between the vocoder and the microprocessor is at a 4 kbps rate with the parameters encoded for each frame using 80 bits. At quarter rate, also referred to as rate ¼, data transmission between the vocoder and the microprocessor is at a 2 kbps rate with the parameters encoded for each frame using 40 bits. At eighth rate, also referred to as rate ⅛, data transmission between the vocoder and the microprocessor is slightly less than a 1 kbps rate with the parameters encoded for each frame using 16 bits.

In the communication system in which vocoder 16 is implemented it may also be desirable to send signaling or other non-vocoder data. In the case where all signaling or other non-vocoder data is to be transmitted rather than vocoder data, which is referred to as a blank frame, the vocoder data for the frame need not be transferred to the microprocessor for transmission.

Depending upon the data transmission rate, searches are performed to compute the pitch filter and codebook excitation parameters multiple times on different subframes of each speech frame. At all rates, there is only one LPC computation per speech frame. With only one rate selected for each frame, the pitch and codebook searches are done in various size subframes corresponding to the selected rate as described below.

At full rate there are four pitch subframes and two codebook subframes for each pitch subframe. At full rate there are four pitch updates, one for each of the four pitch subframes, each 40 samples long (5 msec.). Furthermore at full rate there are eight codebook updates, one for each of the eight codebook subframes, each 20 samples long (2.5 msec.).

At half rate, there are two pitch subframes and two codebook subframes for each pitch subframe. Pitch is updated twice, once for each of the two pitch subframes while the codebook is updated four times, once for each of the four codebook subframes. At quarter rate, there is one pitch subframe and two codebook subframes for the single pitch subframe. Pitch is updated once for the pitch subframe while the codebook twice, once for each of the two codebook subframes. At eighth rate, pitch is not determined and the codebook is updated only once in the speech frame.

Although the LPC coefficients are computed only once per frame, they are linearly interpolated, in a Line Spectral Pair (LSP) representation, up to six times using the resultant LSP frequencies from the previous frame to approximate the results of LPC analysis with a Hamming window centered on each subframe. The exception is that at full rate, the LPC coefficients are not interpolated for the codebook subframes.

In addition to performing the pitch and codebook searches less often at lower rates, less bits are also allocated for the transmission of the LPC coefficients. The number of bits allocated at the various rates is shown in FIGS. 2a–2d. Each one of FIGS. 2a–2d represents the number of vocoder encoded data bits allocated to each 160 sample frame of speech. In FIGS. 2a–2d, the number in the respective LPC block is the number of bits used at the corresponding rate to encode the short term LPC coefficients. In the preferred embodiment the number of bits used to encode the LPC coefficients at full, half, quarter and eighth rates are respectively 40, 20, 10 and 10.

In order to implement variable rate coding, the LPC coefficients are first transformed into Line Spectrum Pairs (LSP) and the resulting LSP frequencies are individually encoded using DPCM coders. The LPC order is 10, such that there are 10 LSP frequencies and 10 independent DPCM coders. The exemplary bit allocation for the DPCM coders at full, half, quarter and eighth rates is respectively 4, 2, 1 and 1. In the vocoder the LSP frequencies are converted back to LPC filter coefficients for use in the pitch and codebook searches.

With respect to the pitch search, at full rate as illustrated in FIG. 2a, the pitch update is computed four times, once for each quarter of the speech frame. For each pitch update at the full rate, 10 bits are used to encode the new pitch parameters. Pitch updates are done a varying numbers of times for the other rates as shown in FIGS. 2b–2d. As the rate decreases the number of pitch updates also decreases. FIGS. 2b illustrates the pitch updates for half rate which are computed twice, once for each half of the speech frame. Similarly FIG. 2c illustrates the pitch updates for quarter rate which is computed once every full speech frame. As was for full rate, 10 bits are used to encode the new pitch parameters for each half and quarter rate pitch update. However for eighth rate, as illustrated in FIG. 2d, no pitch update is computed since this rate is used to encode frames when little or no speech is present and pitch redundancies do not exist.

For each 10 bit pitch update, 7 bits represent the pitch lag and 3 bits represent the pitch gain. The pitch lag is limited to be between 17 and 143. The pitch gain is linearly quantized to between 0 and 2 for representation by the 3 bit value.

With respect to the codebook search, at full rate as illustrated in FIG. 2a, the codebook update is computed eight times, once for each eighth of the speech frame. For each codebook update at the full rate, 10 bits are used to encode the new codebook parameters. Codebook updates are done a varying number of times in the other rates as shown in FIGS. 2b–2d. However, as the rate decreases the number of codebook updates also decreases. FIG. 2b illustrates the codebook updates for half rate which is computed four times, once for each quarter of the speech frame. FIG. 2c illustrates the codebook updates for quarter rate which is computed twice, once for each half of the speech frame. As was for full rate, 10 bits are used to encode the new codebook parameters for each half and quarter rate pitch update. Finally, FIG. 2d illustrates the codebook updates for eighth rate which is computed once every full speech frame. It should be noted that at eighth rate 6 bits are transmitted, 2 bits representative of the codebook gain while the other 4 bits are random bits. Further discussion on the bit allocations for the codebook updates are described in further detail below.

The bits allocated for the codebook updates represent the data bits needed to vector quantize the pitch prediction residual. For full, half and quarter rates, each codebook update is comprised of 7 bits of codebook index plus 3 bits of codebook gain for a total of 10 bits. The codebook gain is encoded using a differential pulse code modulation (DPCM) coder operating in the log domain. Although a similar bit arrangement can be used for eighth rate, an alternate scheme is preferred. At eighth rate codebook gain is represented by 2 bits while 4 randomly generated bits are used with the received data as a seed to a pseudorandom number generator which replaces the codebook. It should be understood that in the alternative codebook data may be output rather than using the pseudorandom number generator approach.

Table I as follows is a chart which illustrates the various parameters and bit allocations therefore generated by the vocoder for each speech frame, and also used by the vocoder in reconstructing speech samples for a speech frame.

TABLE I

| Code | Rate | | | | Code | Rate | | | |
| | 1 | ½ | ¼ | ⅛ | | 1 | ½ | ¼ | ⅛ |
| --- | --- | --- | --- | --- | --- | --- | --- | --- | --- |
| LSP1 | 4 | 2 | 1 | 1 | CBINDEX1 | 7 | 7 | 7 | — |
| LSP2 | 4 | 2 | 1 | 1 | CBINDEX2 | 7 | 7 | 7 | — |
| LSP3 | 4 | 2 | 1 | 1 | CBINDEX3 | 7 | 7 | — | — |
| LSP4 | 4 | 2 | 1 | 1 | CBINDEX4 | 7 | 7 | — | — |
| LSP5 | 4 | 2 | 1 | 1 | CBINDEX5 | 7 | — | — | — |
| LSP6 | 4 | 2 | 1 | 1 | CBINDEX6 | 7 | — | — | — |
| LSP7 | 4 | 2 | 1 | 1 | CBINDEX7 | 7 | — | — | — |
| LSP8 | 4 | 2 | 1 | 1 | CBINDEX8 | 7 | — | — | — |
| LSP9 | 4 | 2 | 1 | 1 | CBGAIN1 | 3 | 3 | 3 | 2 |
| LSP10 | 4 | 2 | 1 | 1 | CBGAIN2 | 3 | 3 | 3 | — |
| PLAG1 | 7 | 7 | 7 | — | CBGAIN3 | 3 | 3 | — | — |
| PLAG2 | 7 | 7 | — | — | CBGAIN4 | 3 | 3 | — | — |

TABLE I-continued

| Code | Rate 1 | 1/2 | 1/4 | 1/8 | Code | Rate 1 | 1/2 | 1/4 | 1/8 |
|---|---|---|---|---|---|---|---|---|---|
| PLAG3 | 7 | — | — | — | CBGAIN5 | 3 | — | — | — |
| PLAG4 | 7 | — | — | — | CBGAIN6 | 3 | — | — | — |
| PGAIN1 | 3 | 3 | 3 | — | CBGAIN7 | 3 | — | — | — |
| PGAIN2 | 3 | 3 | — | — | CBGAIN8 | 3 | — | — | — |
| PGAIN3 | 3 | — | — | — | CBSEED | — | — | — | 4 |
| PGAIN4 | 3 | — | — | — | PCB | 11 | — | — | — |

Table II describes each parameter as referenced in Table I, and also in Tables III–VI:

TABLE II

| | |
|---|---|
| $LSP_i$ | Line Spectral Pair frequency i |
| $PLAG_i$ | Pitch Lag for the $i^{th}$ pitch subframe |
| $PGAIN_i$ | Pitch Gain for the $i^{th}$ pitch subframes |
| $CBINDEX_i$ | Codebook Index for the $i^{th}$ codebook subframe |
| $CBGAIN_i$ | Codebook Gain for the $i^{th}$ codebook subframe |
| CBSEED | Random seed for an eighth rate data packet |
| PCB | Parity Check Bits used to detect and correct errors in a full rate data packet |

As discussed later herein, and in particular reference to Tables III–VI, the least significant bit (LSB) of a particular parameter is referred to as PARAMETER(0) with the more significant bits respectively PARAMETER(1), PARAMETER(2), etc. For example in a full rate frame where $LSP_1$=1011 in binary form, the most significant bit $LSP_1(3)$=1, the next most significant bit $LSP_1(2)$=0, the next to least significant bit $LSP_1(1)$=1, and the least significant bit $LSP_1(0)$=1.

Vocoder 16 organizes the computed parameter bits for each speech frame into data packets for output to microprocessor 18. In the mobile station implementation all elements of vocoding system 10 are located typically within the unit. However in a MTSO/cell base station implementation, microprocessor 18 may be located at the MTSO with vocoder 16 or located at the cell base station with the appropriate transmission interface.

Microprocessor 18 may receive a vocoder data packet in response to a data packet request provided from microprocessor 18 to vocoder 16, or on the initiative of vocoder 16. It should be understood that many different schemes well known in the art may be used in affecting a transfer of the data packet from microprocessor 18 to vocoder 16. Data is packed at vocoder 16 for transfer to microprocessor 18 in a unique arrangement which provides advantages over conventional data formats.

In an exemplary implementation, vocoder 16 communicates with microprocessor 18 via an 8 bit parallel port, with the vocoder operating its parallel port in a passive mode. Under an exemplary communication protocol between microprocessor 18 and vocoder 16, data transfer is always initiated by microprocessor 18. In this communication scheme, data packets sent to vocoder 16 by microprocessor 18 are referred to as command packets while data packets sent from vocoder 16 to microprocessor 18 are referred to as response packets. Commands are sent in the command packets from microprocessor 18 and are acknowledged by vocoder 16 in two levels. First, vocoder 16 indicates whether the packet from microprocessor 18 was received in good shape. If so, it indicates that it understands the command and is carrying out the commanded function by echoing the commands back to microprocessor 18.

Figure 3:
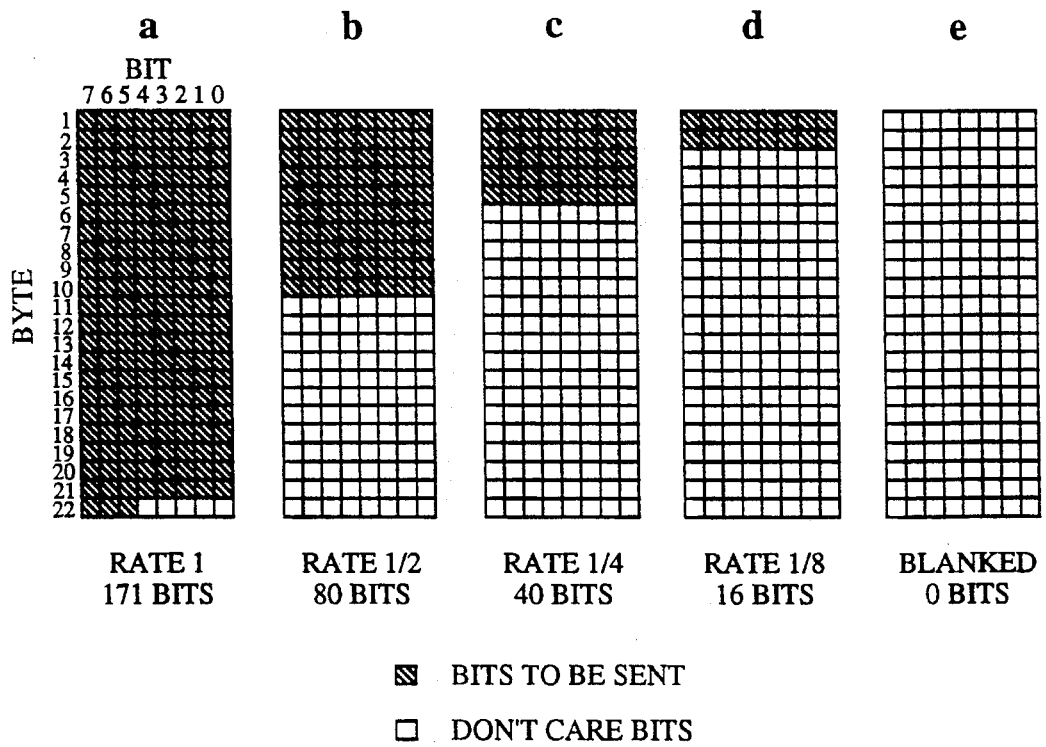
FIGS. 3 graphs a–e are a series of charts illustrating the arrangement of data packets as transferred between the vocoder and microprocessor.

The data packets are transferred between microprocessor 18 and vocoder 16 typically in 22 byte blocks with each byte in a block comprised of 8 data bits. The transfer of a data packet in a block from vocoder 16 to microprocessor 18 for transmission, and from microprocessor 18 to vocoder 16 for decoding of received transmission data is the same. FIGS. 3a–3e illustrate the composition of each vocoded speech frame data packet for each of full, half, quarter, eighth rates, and for a blank frame. In FIGS. 3a–3e, the block of data is represented in graphical form with byte number 1 being transferred first with bit numbers 7 and 0 in each byte respectively being the first and last bits transferred for the respective byte. Since in the exemplary embodiment a constant transfer block is used, while the number of actual data packet bits vary depending on the rate for the data packet, several bits of a byte up to entire bytes are comprised of unneeded bits. FIGS. 3a–3e illustrate this fact by having byte bit positions in the block shaded for bits used and unshaded for bits unused or ignored. FIG. 3e applies to the case where in certain transmissions, the microprocessor provides non-vocoder data, such as signaling data or other user data, for the frame. On the receiving end a blank frame is transferred to the vocoder. In this blank frame in which no vocoder data is present, should the data be transferred from the microprocessor to the vocoder it is ignored.

Figure 4:
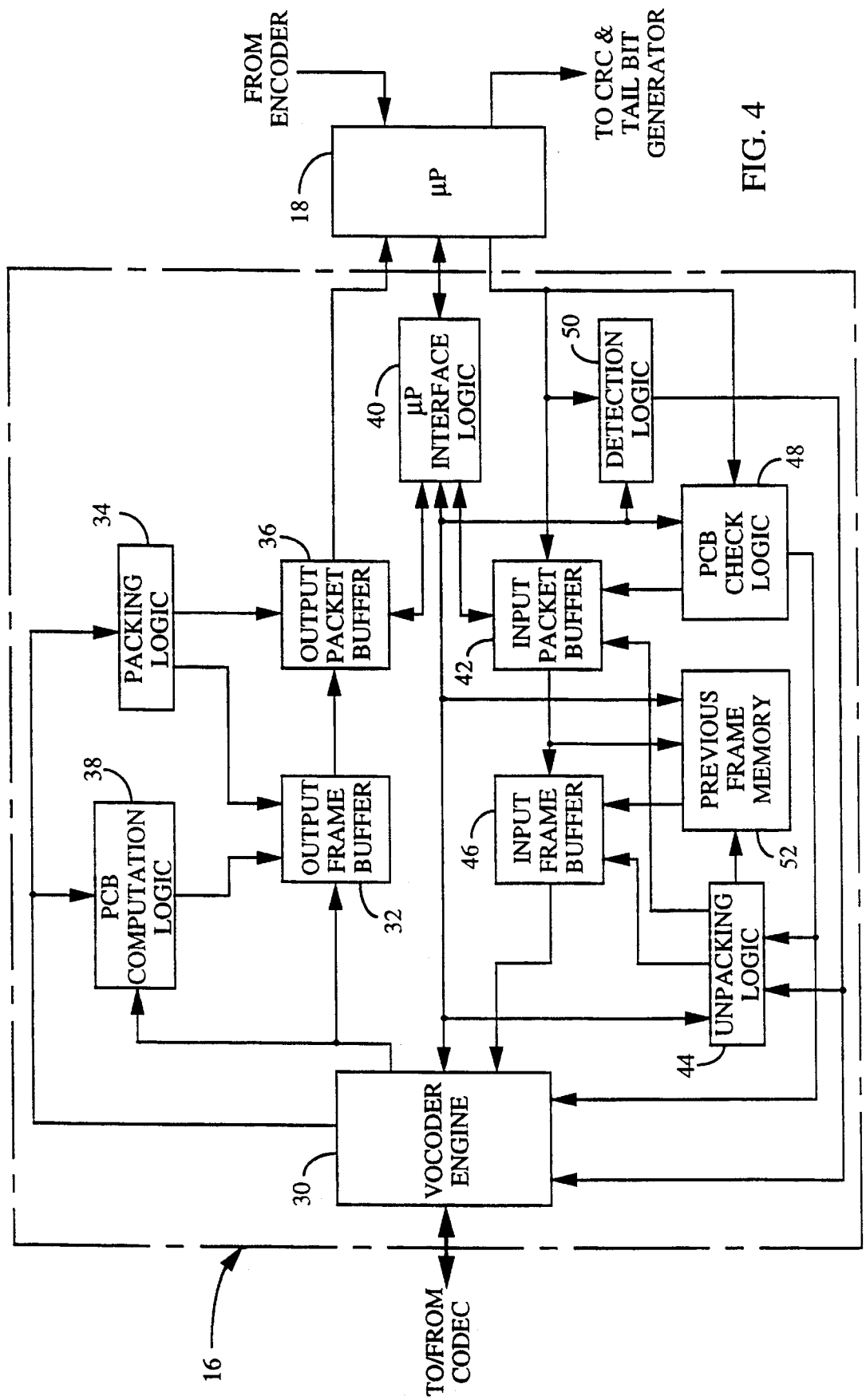
FIG. 4 is a block diagram illustrating the circuitry for assembling vocoder data into packets for transfer from the vocoder to the microprocessor, and for disassembling packets received from the microprocessor at the vocoder into a form for vocoder use in reconstructing speech frame data.

FIG. 4 illustrates in exemplary block diagram form the associated circuitry for organizing the parameter data corresponding to each speech frame into data packets for transmission to the microprocessor. In FIG. 4, vocoder 16 is illustrated as having a vocoder engine 30 which computes the parameter data as described in the above mentioned copending application. Vocoder engine 30 also computes from the received parameter data the corresponding frame of speech samples. Vocoder 16 further comprises output frame buffer 32, packing logic 34, output packet buffer 36, parity check bit logic 38 and microprocessor interface logic 40.

Vocoder engine 30 computes the parameters for each speech frame and provides an output frame of the corresponding parameter data bits to output frame buffer 32 where temporarily stored. The parameter data may also be provided directly to parity check bit logic 38 for computation of the parity check bits for full rate data. Vocoder engine 30 also for each speech frame provides an output indicative of the rate selected for the vocoded speech frame. The rate data is typically provided to packing logic 34, parity check bit logic 38 and microprocessor 18 via microprocessor interface logic 40.

In the alternative, the frame parameter data may be provided from buffer 32 to parity check bit logic 38 for each speech frame or only in response to rate data indicative of a full rate frame. In this configuration, the rate indication may also be provided to buffer 32 which is responsive to a full rate indication for providing the parameter data to parity check bit logic 38.

Parity check bit logic 38 is responsive to a full rate indication for computing 11 parity check bits based upon the 18 most perceptually significant bits of the full rate data. The bits which are designated as of the group of perceptually significant bits have been determined to most adversely affect speech quality in the decoded speech should an error occur in one of these bits. The parity check bits are added to the full rate data packet to provide error correction to these 18 most perceptually significant bits. In an exemplary and preferred embodiment, the error protection generated by parity check bit logic 38 is based upon a cyclic code to generate 10 parity bits to form a (28, 18) code, where the cyclic code is a shortened BCH code. The terminology (n, k) implies that the code word is n bits long and there are k information bits. A single parity check bit is computed using the 28 bits of this code so as to form a final (29, 18) code.

The 18 most perceptually significant bits are assembled into an input polynomial in the GF(2), a Galois Field of two elements, according to equation (1) as follows:

$$a(X) = LSP_1[3]x^{17} + LSP_2[3]x^{16} + LSP_3[3]x^{15} + \\ LSP_4[3]x^{14} + LSP_5[3]x^{13} + LSP_6[3]x^{12} + LSP_7[3]x^{11} + \\ LSP_8[3]x^{10} + LSP_9[3]x^9 + LSP_{10}[3]x^8 + CBGAIN_1[1]x^7 + \\ CBGAIN_2[1]x^6 + CBGAIN_3[1]x^5 + CBGAIN_4[1]x^4 + \\ CBGAIN_5[1]x^3 + CBGAIN_6[1]x^2 + CBGAIN_7[1]x^1 + \\ CBGAIN_8[1]x^0. \quad (1)$$

where $LSP_i[3]$ is the most significant bit (MSB) of the LSP code i, $CBGAIN_i[1]$ is the second-most MSB of CBGAIN code i, and xj represents a bit position in the polynomial for the parameter bit. In effect, a(x) is made up of the MSBs of all ten LSP codes, and the second-most MSB of the CBGAIN codes.

The first 10 parity check bits are generated using the cyclic code with a generator polynomial of:

$$g_{pc}(x) = x^{10} + x^9 + x^8 + x^6 + x^5 + x^3 + 1. \quad (2)$$

The term r(x) shall be defined as the remainder of the binary division of the input polynomial and the generator polynomial $$a(x)x^{10}/g_{pc}(x) = q(x) + r(x)/g_{pc}(x). \quad (3)$$

where $a(x)x^{10}$ is 10 bit position shift of a(x) with q(x) being the quotient of the division, and r(x) being the remainder of the division. The quotient q(x) is not used and the bits of r(x) shall be assigned according to equation 4 as follows:

$$r(x) = \overline{PCB[10]}\, x^9 + \overline{PCB[9]}\, x^8 + \overline{PCB[8]}\, x^7 + \overline{PCB[7]}\, x^6 + \overline{PCB[6]}\, x^5 + \\ \overline{PCB[5]}\, x^4 + \overline{PCB[4]}\, x^3 + \overline{PCB[3]}\, x^2 + \overline{PCB[2]}\, x^1 + \overline{PCB[1]}\, x^0. \quad (4)$$

It should be noted that PCB[1] through PCB[10] are inverted before transmission and before PCB[0], the 11th protection bit, is determined. PCB[0] shall be a parity bit on the 18 protected bits in a(x) and the ten parity check bits in r(x). PCB[0] shall be a logical "0" if the exclusive-OR of all 28 bits results in "0"; PCB[0]) shall be a logical "1" if the exclusive-OR of all 28 bits results in "1". That is, $$PCB[0] = LSP1[3] \oplus LSP2[3] \oplus LSP3[3] \oplus LSP4[3] \oplus \quad (5)$$

-continued
$$LSP5[3] \oplus LSP6[3] \oplus LSP7[3] \oplus LSP8[3] \oplus LSP9[3] \oplus \\ LSP10[3] \oplus CBGAIN1[1] \oplus CBGAIN2[1] \oplus CBGAIN3[1] \oplus \\ CBGAIN4[1] \oplus CBGAIN5[1] \oplus CBGAIN6[1] \oplus \\ CBGAIN7[1] \oplus CBGAIN8[1] \oplus PCB[10] \oplus PCB[9] \oplus \\ PCB[8] \oplus PCB[7] \oplus PCB[6] \oplus PCB[5] \oplus PCB[4] \oplus \\ PCB[3] \oplus PCB[2] \oplus PCB[1]$$

where $\oplus$ denotes the exclusive-OR of the operands.

Logic 38 may be constructed using conventional processing/logic elements. Logic 38 performs the multiplications and divisions as just ordinary multiplies and divides of one polynomial with another, except that the coefficients are restricted to be binary and the arithmetic is performed modulo 2 with no carries or borrows.

Logic 38 provides an output of the parity check bits to buffer 32 for temporary storage. As mentioned previously the parameter bits as set forth in Table I are provided to buffer 32 from vocoder engine 30, along with the parity check bits for a full rate frame. These frame bits are then packed for transmission.

Packing logic 34 receives the rate indication for each frame and in response thereto addresses buffer 32 to output parameter bits, and parity check bits if applicable, in a specified order. The bits output from buffer 32 are provided to packet buffer 36 for eventual transfer to microprocessor 18 as discussed with reference to FIG. 3. It should be understood that in the alternative, bits may be output from buffer 32 directly to microprocessor 18 in an organized manner as discussed herein. It should also be understood that buffers 32 and 36 may configured as a single memory. In any implementation the bits are organized for each rate as set forth in Tables III–VI.

In general, vocoder 16 provides an output of the parameter data to microprocessor 18 in an order which corresponds to the analysis of the speech frame as discussed with reference to FIGS. 2a–2d. The LSP data which is based upon the entire frame of speech samples are provided near the beginning of the packet. The pitch data from the first pitch subframe of speech samples in the frame are provided next. The pitch data is then followed by the codebook data from the codebook subframe(s) of speech samples which correspond to the speech samples of the first pitch subframe of speech samples. If more than one codebook subframes of speech samples correspond to the pitch subframe of speech samples, then the codebook data for the first codebook subframe is provided and followed by the codebook data for the next codebook subframe. After the codebook data for the codebook subframes which correspond to the pitch subframe is output, the pitch data for the next pitch subframe of speech samples is provided, if present for the encoding rate. The codebook data for this next pitch subframe are then output as discussed previously. For the speech sample frame, should there be more pitch subframes and corresponding codebook subframes of speech samples for which pitch and codebook data is generated, the pitch data is output first followed by the corresponding codebook data. This output process is repeated for any remaining pitch and codebook data for the speech sample frame. In general for the pitch subframe the pitch gain values are placed before the pitch lag values in the data packet. Similarly for the codebook subframes the codebook index values are place before the codebook gain values in the data packet. Specifics on the deviations from this general exemplary implementation of ordering of the parameter data are provided in Tables III–VI.

Furthermore it should be understood that various other ordering schemes may be readily implemented, but retain the novel aspects in ordering of the parameter data.

Referring to Table III, the 171 bits of full rate frame data are packed into a primary traffic packet. Bit 170 is the first primary traffic bit in the primary traffic packet with bit 0 being the last. As can be seen in Table III, the most significant bit and second-most significant bits of the ten 4-bit LSP codes, are placed at the beginning of the packet. These first 20 bits of the data packet are bits that are among the group of bits that are the most perceptually significant. Following these first 20 most perceptually significant bits in the data packet are the lesser significant bits of the LSP codes. Following the lesser significant bits of the LSP codes burst will hit only one of the interleaved bits. Since parity check bits are used for single error correction in full rate likely packet, the interleaving implies that correction can be made to errors in the important bits in a length 8 burst.

As mentioned previously, in the preferred ordering scheme data from each pitch subframe and corresponding codebook subframe, as set forth in FIG. 2a, are provided. The data from the first pitch subframe is followed respectively by the data from the corresponding first and second codebook subframes. Similar is the ordering for the following pitch subframe data and corresponding codebook subframe data through the rest of the coded speech frame.

TABLE III

| Bit | Code | Bit | Code | Bit | Code | Bit | Code |
|---|---|---|---|---|---|---|---|
| 170 | LSP1[2] | 146 | LSP3[1] | 122 | PLAG1[4] | 98 | CBGAIN2[2] |
| 169 | LSP1[3] | 145 | LSP3[0] | 121 | PLAG1[3] | 97 | CBGAIN2[0] |
| 168 | LSP2[2] | 144 | LSP4[1] | 120 | PLAG1[2] | 96 | PGAIN2[2] |
| 167 | LSP2[3] | 143 | CBGAIN1[1] | 119 | CBGAIN4[1] | 95 | CBGAIN7[1] |
| 166 | LSP3[2] | 142 | LSP4[0] | 118 | PLAG1[1] | 94 | PGAIN2[1] |
| 165 | LSP3[3] | 141 | LSP5[1] | 117 | PLAG1[0] | 93 | PGAIN2[0] |
| 164 | LSP4[2] | 140 | LSP5[0] | 116 | CBINDEX1[6] | 92 | PLAG2[6] |
| 163 | LSP4[3] | 139 | LSP6[1] | 115 | CBINDEX1[5] | 91 | PLAG2[5] |
| 162 | LSP5[2] | 138 | LSP6[0] | 114 | CBINDEX1[4] | 90 | PLAG2[4] |
| 161 | LSP5[3] | 137 | LSP7[1] | 113 | CBINDEX1[3] | 89 | PLAG2[3] |
| 160 | LSP6[2] | 136 | LSP7[0] | 112 | CBINDEX1[2] | 88 | PLAG2[2] |
| 159 | LSP6[3] | 135 | CBGAIN2[1] | 111 | CBGAIN5[1] | 87 | CBGAIN8[1] |
| 158 | LSP7[2] | 134 | LSP8[1] | 110 | CBINDEX1[1] | 86 | PLAG2[1] |
| 157 | LSP7[3] | 133 | LSP8[0] | 109 | CBINDEX1[0] | 85 | PLAG2[0] |
| 156 | LSP8[2] | 132 | LSP9[1] | 108 | CBGAIN1[2] | 84 | CBINDEX3[6] |
| 155 | LSP8[3] | 131 | LSP9[0] | 107 | CBGAIN1[0] | 83 | CBINDEX3[5] |
| 154 | LSP9[2] | 130 | LSP10[1] | 106 | CBINDEX2[6] | 82 | CBINDEX3[4] |
| 153 | LSP9[3] | 129 | LSP10[0] | 105 | CBINDEX2[5] | 81 | CBINDEX3[3] |
| 152 | LSP10[2] | 128 | PGAIN1[2] | 104 | CBINDEX2[4] | 80 | CBINDEX3[2] |
| 151 | LSP10[3] | 127 | CBGAIN3[1] | 103 | CBGAIN6[1] | 79 | PCB[10] |
| 150 | LSP1[1] | 126 | PGAIN1[1] | 102 | CBINDEX2[3] | 78 | CBINDEX3[1] |
| 149 | LSP1[0] | 125 | PGAIN1[0] | 101 | CBINDEX2[2] | 77 | CBINDEX3[0] |
| 148 | LSP2[1] | 124 | PLAG1[6] | 100 | CBINDEX2[1] | 76 | CBGAIN3[2] |
| 147 | LSP2[0] | 123 | PLAG1[5] | 99 | CBINDEX2[0] | 75 | CBGAIN3[0] |
| 74 | CBINDEX4[6] | 55 | PCB[7] | 36 | CBINDEX6[1] | 17 | CBINDEX7[3] |
| 73 | CBINDEX4[5] | 54 | PLAG3[1] | 35 | CBINDEX6[0] | 16 | CBINDEX7[2] |
| 72 | CBINDEX4[4] | 53 | PLAG3[0] | 34 | CBGAIN6[2] | 15 | PCB[2] |
| 71 | PCB[9] | 52 | CBINDEX5[6] | 33 | CBGAIN6[0] | 14 | CBINDEX7[1] |
| 70 | CBINDEX4[3] | 51 | CBINDEX5[5] | 32 | PGAIN4[2] | 13 | CBINDEX7[0] |
| 69 | CBINDEX4[2] | 50 | CBINDEX5[4] | 31 | PCB[4] | 12 | CBGAIN7[2] |
| 68 | CBINDEX4[1] | 49 | CBINDEX5[3] | 30 | PGAIN4[1] | 11 | CBGAIN7[0] |
| 67 | CBINDEX4[0] | 48 | CBINDEX5[2] | 29 | PGAIN4[0] | 10 | CBINDEX8[6] |
| 66 | CBGAIN4[2] | 47 | PCB[6] | 28 | PFLAG4[6] | 9 | CBINDEX8[5] |
| 65 | CBGAIN4[0] | 46 | CBINDEX5[1] | 27 | PLAG4[5] | 8 | CBINDEX8[4] |
| 64 | PGAIN3[2] | 45 | CBINDEX5[0] | 26 | PLAG4[4] | 7 | PCB[1] |
| 63 | PCB[8] | 44 | CBGAIN5[2] | 25 | PLAG4[3] | 6 | CBINDEX8[3] |
| 62 | PGAIN3[1] | 43 | CBGAIN5[0] | 24 | PLAG4[2] | 5 | CBINDEX8[2] |
| 61 | PGAIN3[0] | 42 | CBINDEX6[6] | 23 | PCB[3] | 4 | CBINDEX8[1] |
| 60 | PLAG3[6] | 41 | CBINDEX6[5] | 22 | PLAG4[1] | 3 | CBINDEX8[0] |
| 59 | PLAG3[5] | 40 | CBINDEX6[4] | 21 | PLAG4[0] | 2 | CBGAIN8[2] |
| 58 | PLAG3[4] | 39 | PCB[5] | 20 | CBINDEX7[6] | 1 | CBGAIN8[0] |
| 57 | PLAG3[3] | 38 | CBINDEX6[3] | 19 | CBINDEX7[5] | 0 | PCB[0] |
| 56 | PLAG3[2] | 37 | CBINDEX6[2] | 18 | CBINDEX7[4] | | | in the data packet are the remaining parameter codes, with the exception of the most significant bit of the eight codebook gain codes and the parity check bits. The most significant bit of the eight codebook gain codes and the parity check bits are also considered as bits of the group of most perceptually significant bits. Interleaved within the lesser significant bits of the LSP codes and the following parameter codes in the data packet, every eighth bit, are these remaining most perceptually significant bits.

The bit interleaving in the packet is done because the errors are bursts of an average length of 8 bits. In interleaving important bits throughout the packet on average, a single The full rate primary traffic packet is then organized by microprocessor 18 into a transmission packet which also includes a signalling bit, frame quality indicator bits and end of frame bits (encoder tail bits). The frame quality indicator bits are in essence cyclic redundancy check (CRC) bits generated from the full rate primary traffic packet bits by a CRC and Tail Bit generator circuit (not shown) following microprocessor 18. Referring to FIG. 5a, for full rate the transmission packet is comprised of 192 bits in which the first bit is a signaling bit. The signaling bit is followed by the 171 bits of the primary traffic packet which is then followed by the 12 CRC bits. Following the CRC bits in the transmission packet are the 8 tail bits, which are all zeros. The transmission packet is encoded for transmission in a transmission frame which spans a 20 ms. time period so as to realize a data rate of 9.6 kbps.

The 80 bits of half rate frame data are also packed into a primary traffic packet as illustrated in Table IV. Bit 79 is the first primary traffic bit in the primary traffic packet with bit 0 again being the last. As can be seen in Table IV the bits of the ten 2-bit LSP codes, are placed at the beginning of the packet as a matter of convenience and consistency. Following these first 20 bits are the bits of the remaining significant parameter codes as was for full rate data, with again some interleaving of the codebook gain bits.

sources other than the vocoder, secondary traffic, (FIG. 5c) at the 9.6 kbps data rate. It should further be understood that full rate vocoder data may be blanked, not generated, and other data inserted into the transmission packet as illustrated in FIGS. 5d–5e.

The 40 bits of quarter rate frame data are packed into a primary traffic packet as illustrated in Table V. Bit 39 is the first primary traffic bit in the primary traffic packet with bit 0 again being the last. As can be seen in Table V, the single bit of the ten 1-bit LSP codes, are placed at the beginning of the packet. Following these first 10 bits are the bits of the remaining parameter codes, with again some interleaving of the codebook gain bits.

TABLE IV

| Bit | Code | Bit | Code | Bit | Code | Bit | Code |
|-----|------|-----|------|-----|------|-----|------|
| 79 | LSP1[1] | 59 | PGAIN1[2] | 39 | CBINDEX2[6] | 19 | CBINDEX3[6] |
| 78 | LSP1[0] | 58 | PGAIN1[1] | 38 | CBINDEX2[5] | 18 | CBINDEX3[5] |
| 77 | LSP2[1] | 57 | PGAIN1[0] | 37 | CBINDEX2[4] | 17 | CBINDEX3[4] |
| 76 | LSP2[0] | 56 | PLAG1[6] | 36 | CBINDEX2[3] | 16 | CBINDEX3[3] |
| 75 | LSP3[1] | 55 | PLAG1[5] | 35 | CBINDEX2[2] | 15 | CBINDEX3[2] |
| 74 | LSP3[0] | 54 | PLAG1[4] | 34 | CBINDEX2[1] | 14 | CBINDEX3[1] |
| 73 | LSP4[1] | 53 | PLAG1[3] | 33 | CBINDEX2[0] | 13 | CBINDEX3[0] |
| 72 | LSP4[0] | 52 | PLAG1[2] | 32 | CBGAIN2[2] | 12 | CBGAIN3[2] |
| 71 | LSP5[1] | 51 | PLAG1[1] | 31 | CBGAIN2[1] | 11 | CBGAIN3[1] |
| 70 | LSP5[0] | 50 | PLAG1[0] | 30 | CBGAIN2[0] | 10 | CBGAIN3[0] |
| 69 | LSP6[1] | 49 | CBINDEX1[6] | 29 | PGAIN2[2] | 9 | CBINDEX4[6] |
| 68 | LSP6[0] | 48 | CBINDEX1[5] | 28 | PGAIN2[1] | 8 | CBINDEX4[5] |
| 67 | LSP7[1] | 47 | CBINDEX1[4] | 27 | PGAIN2[0] | 7 | CBINDEX4[4] |
| 66 | LSP7[0] | 46 | CBINDEX1[3] | 26 | PLAG2[6] | 6 | CBINDEX4[3] |
| 65 | LSP8[1] | 45 | CBINDEX1[2] | 25 | PLAG2[5] | 5 | CBINDEX4[2] |
| 64 | LSP8[0] | 44 | CBINDEX1[1] | 24 | PLAG2[4] | 4 | CBINDEX4[1] |
| 63 | LSP9[1] | 43 | CBINDEX1[0] | 23 | PLAG2[3] | 3 | CBINDEX4[0] |
| 62 | LSP9[0] | 42 | CBGAIN1[2] | 22 | PLAG2[2] | 2 | CBGAIN4[2] |
| 61 | LSP10[1] | 41 | CBGAIN1[1] | 21 | PLAG2[1] | 1 | CBGAIN4[1] |
| 60 | LSP10[0] | 40 | CBGAIN1[0] | 20 | PLAG2[0] | 0 | CBGAIN4[0] |

Figure 5F:
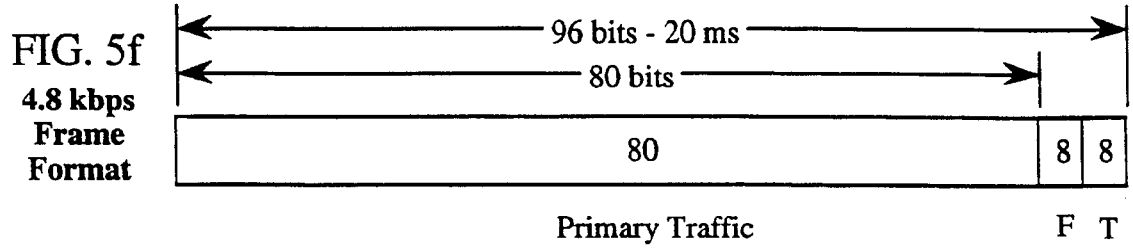

The half rate primary traffic packet is then organized by microprocessor 18 into a transmission packet which also includes frame quality indicator bits and encoder tail bits. The frame quality indicator bits are again cyclic redundancy check (CRC) bits generated from the half rate primary traffic packet bits by the CRC circuit. Referring to FIG. 5f, for half rate the transmission packet is comprised of 96 bits which begins with the 80 bits of the primary traffic packet. The bits

TABLE V

| Bit | Code | Bit | Code | Bit | Code | Bit | Code |
|-----|------|-----|------|-----|------|-----|------|
| 39 | LSP1[0] | 29 | PGAIN1[2] | 19 | CBINDEX1[6] | 9 | CBINDEX2[6] |
| 38 | LSP2[0] | 28 | PGAIN1[1] | 18 | CBINDEX1[5] | 8 | CBINDEX2[5] |
| 37 | LSP3[0] | 27 | PGAIN1[0] | 17 | CBINDEX1[4] | 7 | CBINDEX2[4] |
| 36 | LSP4[0] | 26 | PLAG1[6] | 16 | CBINDEX1[3] | 6 | CBINDEX2[3] |
| 35 | LSP5[0] | 25 | PLAG1[5] | 15 | CBINDEX1[2] | 5 | CBINDEX2[2] |
| 34 | LSP6[0] | 24 | PLAG1[4] | 14 | CBINDEX1[1] | 4 | CBINDEX2[1] |
| 33 | LSP7[0] | 23 | PLAG1[3] | 13 | CBINDEX1[0] | 3 | CBINDEX2[0] |
| 32 | LSP8[0] | 22 | PLAG1[2] | 12 | CBGAIN1[2] | 2 | CBGAIN2[2] |
| 31 | LSP9[0] | 21 | PLAG1[1] | 11 | CBGAIN1[1] | 1 | CBGAIN2[1] |
| 30 | LSP10[0] | 20 | PLAG1[0] | 10 | CBGAIN1[0] | 0 | CBGAIN2[0] | of the primary traffic packet are followed by the 8 CRC bits which are then followed by the 8 tail bits. The transmission packet is again encoded for transmission in a transmission frame which spans a 20 msec. time period to realize an effective data rate of 4.8 kbps.

Figure 5G:
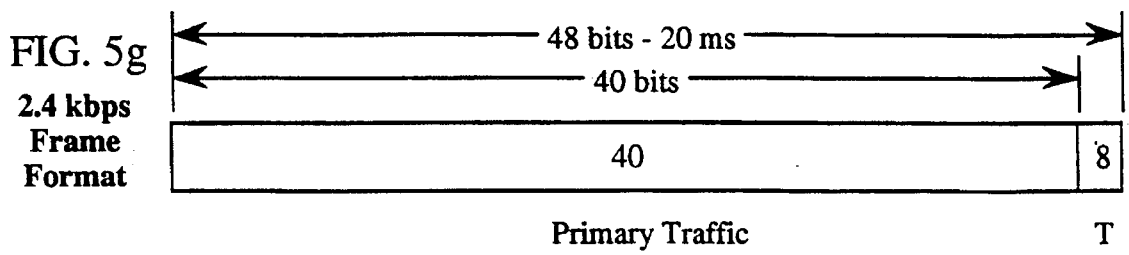

It should be understood that half rate data may be transferred in the transmission packet along with other data such as signaling data, signaling traffic, (FIG. 5b) or data from The quarter rate primary traffic packet is then organized by microprocessor 18 into a transmission packet which also includes only the 8 encoder tail bits. Referring to FIG. 5g, for quarter rate the transmission packet is thus comprised of 48 bits which begins with the 40 bits of the primary traffic packet and ends in the 8 tail bits. The transmission packet is again encoded for transmission in a transmission frame which spans a ms. time period to realize an effective data rate of 2.4 kbps.

The 16 bits of eighth rate frame data are packed into a primary traffic packet as illustrated in Table VI. Bit 15 is the first primary traffic bit in the primary traffic packet with bit 0 again being the last. As can be seen in Table VI, the single bit of the ten 1-bit LSP codes, are placed at the beginning of the packet with an interleaving of the codebook seed therein. Following these bits are the bits of the remaining parameter code.

TABLE VI

| Bit Code | Bit Code | Bit Code | Bit Code |
|---|---|---|---|
| 15 CBSEED[3] | 11 CBSEED[2] | 7 CBSEED[1] | 3 CBSEED[0] |
| 14 LSP1[0] | 10 LSP4[0] | 6 LSP7[0] | 2 LSP10[0] |
| 13 LSP2[0] | 9 LSP5[0] | 5 LSP8[0] | 1 CBGAIN1[1] |
| 12 LSP3[0] | 8 LSP6[0] | 4 LSP9[0] | 0 CBGAIN1[0] |

Figure 5H:
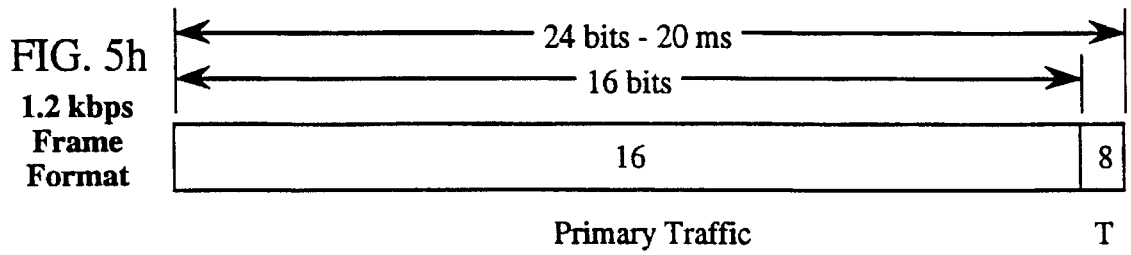

The eighth rate primary traffic packet is then organized by microprocessor 18 into a transmission packet which also includes only the 8 encoder tail bits. Referring to FIG. 5h, for eighth rate the transmission packet is thus comprised of 24 bits which begins with the 16 bits of the primary traffic packet and ends in the 8 tail bits. The transmission packet is again encoded for transmission in a transmission frame which spans a 20 ms. time period to realize an effective data rate of 1.2 kbps.

Referring again to FIG. 3, the primary traffic packets are transferred from vocoder 16 in response to a data output command from microprocessor 18. In response to this command, which is processed by microprocessor interface logic 40, logic 40 provides a transfer command to buffer 36. Buffer 36 in response to the transfer command outputs the formatted packet in bytes to microprocessor 18 as discussed with reference to FIG. 3.

In the vocoding system of FIG. 1 received vocoded speech frames are also reconstructed into the speech frame samples. At the receiver the communication of data between microprocessor 18 and vocoder 16 is similar to that for transmission. In this mode of operation vocoder 16 receives and unpacks data packets from microprocessor 18 for decoding and speech sample reconstruction. The primary traffic packets are transferred from microprocessor 18 to vocoder 16 along with a data input command from microprocessor 18. Microprocessor 18 which also determines the rate of the data packets for vocoder decoding purposes and provides an indication of the determined rate to vocoder 16.

Microprocessor 18 also determines the quality of the received data. If the received packet is corrupted to an extent that is uncorrectable using the error correction techniques (insufficient frame quality) an erasure indication is sent to vocoder 16 as a rate indication. In this case although microprocessor 18 may send the data packet to vocoder 16, these values are not used in the decoding process. Furthermore should microprocessor 18 determine that the data packet is a full rate packet with a detected error in the received transmission packet data, based upon a check of the CRC, an indication that the packet is a full rate packet with probable bit error is provided to vocoder 16. Since the CRC is computed from the data packet bits, one or more errors occurring within the data packet bits will be detected. In vocoder 16 the corrupted data packet bits, if correctable, are corrected and the corrected data packet used by vocoder 16.

Another possibility for the received transmission packet is that it contains data other than vocoder data, such as signaling or secondary traffic data. For example, in transmission the vocoder data shares the transmission frame with other digital data (FIGS. 6b–6c) or is exclusively non-vocoder data (FIGS. 6d–6e). In this case the mode data in the transmission packet indicates the packet type as containing vocoder data only or one which contains other data, such as a combination of vocoder and non-vocoder data, or non-vocoder data only. A burst format bit further indicates whether the packet is a combination of vocoder and non-vocoder data, or is non-vocoder data only. When the transmission packet is received and detected as containing non-vocoder data only, a blank frame indication is provided from microprocessor 18 to vocoder 16. Although data may be transferred from microprocessor 18 to vocoder 16 it is not used. Instead vocoder 16 uses data stored internally to update the state of the vocoder.

Referring to FIGS. 1 and 4, in all cases vocoder 16 is responsive to a data input command from microprocessor 18, which is processed by microprocessor interface logic 40 and provides a transfer command to buffer 36. Buffer 36 in response to the transfer command receives the formatted packet in bytes from microprocessor 18 as discussed with reference to FIG. 3. Logic 40 also transfers rate indications between vocoder 16 and microprocessor 18.

The transferred data packet is input to packet buffer 42 where temporarily stored. In coordination with the data packet transfer, the rate indication for the determined rate of the data packet is provided to unpacking logic 44 via logic 40. In general, unpacking logic 44 is responsive to the rate indication for controlling the output of packet data from buffer 42 to frame buffer 46. The unpacked parameter data is then stored in buffer 46 for providing to vocoder engine 30. Vocoder engine 30 receives the rate indication from microprocessor 18 in addition to the corresponding unpacked parameter data for decoding at the indicated rate. It should be understood that in an alternative configuration buffer 46 may be eliminated and the data be provided directly from buffer 42 to vocoder engine 30 under the control of logic 44.

In the unpacking of full rate vocoder data packet, as for all rate vocoder data packets, logic 44 coordinates the output of data from buffer 42 for storage in buffer 46. For parameter data in which the parameter bits were split apart in the packing process, the bit portions are recombined to form a corresponding complete bit value. For example, for a full rate vocoder data packet the most significant and second-most significant bits of each LSP code is combined with the corresponding lesser significant bits of the LSP code. Thus the ten LSP codes are reconstructed as 4-bit values as stored in buffer 46. Furthermore, parameter data interleaved within the packet is grouped with corresponding parameter data. For example, for a full rate vocoder data packet the parity check bits are grouped together as stored in buffer 46. Parameter data may further be organized according to sample frame and subframe for input to the vocoder. It should be realized that may other schemes may be readily used in and for the organization of parameter data for input to the vocoder.

In the unpacking of a full rate data packet, buffer 42 provides an output of the parameter data to buffer 46 in accordance with signals from logic 44. Parameters having their data bits separated in the packet are organized to form complete parameter bit values. For example as mentioned above, the most and second-most significant data bits for each LSP parameter are combined with the next-to-least and least significant bits for the LSP parameter to form a respective 4-bit value. Parameter values may also be organized to provide a grouping of similar parameter data, or by analysis subframe, or any other organization scheme. The arranged and organized parameter values are stored within buffer 46 under the control of logic 44.

Once the parameter values are unpacked, parity check bits are computed as was discussed with reference to logic 38, and compared with the received packet parity check bits. Parity check bit check logic 48 receives the appropriate bits from buffer 46 under the command of logic 44 so as to compute the parity check for the packet. Logic 48 is enabled for computing and comparison purposes in response to a full rate indication, and a full rate with probable error as discussed later. Furthermore the received parity check bits are also output from buffer 46 to logic 48 for comparison with the computed parity check bits. In an alternative configuration the received parity check bits, or the parameter bits used to compute the comparison parity check bits, may be extracted directly from the data packet output of microprocessor 18 as input to buffer 42. In yet another alternative configuration the received parity check bits or the parameter bits used to compute the comparison parity may be extracted from the output of buffer 42.

For the full rate frame, should no errors be detected in the received parity check bits in comparison with the computed parity check bits a full rate parity check pass indication is provided from logic 48 to logic 44 and vocoder engine 30. Logic 44 in response provides an output command to buffer 46 which responds by outputting the parameter data to vocoder engine 30 where used in reconstructing the speech frame samples.

However should an error be detected in the parity check bits by logic 48, logic 48 generates an insufficient frame quality indication that is also provided to logic 44 and vocoder engine 30. In response to the insufficient frame quality indication, logic 44 may provide an output command to buffer 46 which outputs the data to vocoder engine 30. In this event vocoder engine 30 ignores the received data in response to the insufficient frame quality indication also provided thereto from logic 48. In an alternative implementation the data may not be output from buffer 46 to vocoder engine 30. Vocoder engine 30 operates to reconstruct a frame of speech samples from the previous state of the vocoder.

In the event that microprocessor 18 provides a full rate with probable error (also referred to as full rate likely) indication to logic 40 the data packet is also transferred to buffer 42. A full rate likely indication is generated by microprocessor 18 when for a full rate transmission packet an error is detected in the CRC even though the transmission packet had frame quality metrics provided by the decoder which are indicative of a good packet. The frame quality metrics are used in microprocessor 18 to determine the symbol error rate of the received frames. A low symbol error rate indicates that the received data frames are likely to contain good data.

Before the data packet in buffer 42 is unpacked by logic 44 for transfer to buffer 46, a check of the parity check bits are first made. As was done for a full rate packet, logic 48 computes the parity check bits for the received data packet and compares these with the received parity check bits from the packet itself.

Should logic 48 detect a single error, the error is corrected using well known parity check bit correction techniques with the corrected bit provided to buffer 42 in place of the incorrect bit. Logic 48 also provides a full rate likely parity check pass indication to logic 44 and vocoder engine 30. Logic 44 in response controls the reorganization of the parameter bits and storage in buffer 46. Logic 44 also provides an output command to buffer 46 which responds by outputting the parameter data to vocoder engine 30 where used in reconstructing the speech frame samples.

However should more than one error be detected in the parity check bits by logic 48, logic 48 generates an insufficient frame quality indication that is also provided to logic 44 and vocoder engine 30. In response to the insufficient frame quality indication, logic 44 does not unpack the data packet since the data is not used by vocoder engine 30. The data in buffer 42 may be output to buffer 46 where ignored when transferred to vocoder engine 30. Again vocoder engine 30 ignores the received data in response to the insufficient frame quality indication. As before, vocoder engine 30 operates to reconstruct a frame of speech samples from the previous state of the vocoder.

For half, quarter and eighth rates, the rate indication from microprocessor 18 is provided through logic 40 to logic 44 and vocoder engine 30. Microprocessor 18 also provides the data packet to buffer 42. Logic 44 controls the unpacking of the 80, 40 and 16 bits, respectively for half, quarter and eighth rate, as transferred from buffer 42 to buffer 46. However for eighth rate, should the packet contain all logical ones ("1"), as detected by detection logic 50, an insufficient frame quality indication is generated by logic 50 and provided to logic 44 and vocoder engine 30. Logic 44 and vocoder engine 30 function as discussed just above with respect to the full rate likely condition with multiple errors detected in the parity check bits.

On occasion microprocessor 18 will generate the insufficient frame quality indication as a rate determination indication when the transmission packet CRC check fails and a high symbol error rate is determined from the decoder frame quality metrics. The insufficient frame quality indication is provided through logic 40 to logic 44 and vocoder engine 30. Logic 44 and vocoder engine 30 function as discussed above with respect to the full rate likely condition with multiple errors detected in the parity, check bits.

Furthermore on occasion the received transmission packet may contain data other than vocoder data. The transmission packet may be all other data, or have vocoder data and other data together as discussed above with reference to FIGS. 6b–6e. Microprocessor 18 recognizes this type of transmission data packet based upon signaling bits contained in the packet. In the event that less than the entire transmission packet data portion contains the entire data as signaling or secondary traffic (FIGS. 6d–6e) a blank indication is provided from microprocessor 18 through logic 40 to logic 44, vocoder engine 30, and memory 52. Memory 52 is provided for storing the previous data output from buffer 42. Logic 44 instructs memory 52 to provide data from memory 52 to buffer 46 in place of the output from buffer 42. In particular, the pitch lag and pitch gain for the last pitch subframe of the previous frame of data along with the LSP frequency data for the previous frame are provided from memory 52 to buffer 46. This data is then provided from memory 52 to vocoder engine 30. In the alternative, the particular data may be provided directly from memory 52 to vocoder engine 30. In yet another alternative implementation all data in memory 52 may be provided to buffer 46. From the previous frame data, vocoder engine 30 generates a current frame of estimated speech samples.

It should be understood from the above that various implementations may be devised to achieve the packing and unpacking of parameter data. Many of the functions for the elements described above can be implemented in various forms, such as in a processor, or distinct logic and memory elements, or a combination of both. It should be understood that the additional protection described with reference to the highest rate encoded data may easily be provided to the lower rate data.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. In a vocoding system a method for formatting vocoded speech parameter data corresponding to a frame of speech samples into a data packet for transmission comprising the steps of:

receiving vocoded speech parameter data wherein certain data of said vocoded speech parameter data is of greater relative importance than other data of said vocoded speech parameter data;

providing a certain portion of said certain data at a beginning of a data packet;

providing, exclusively within a remaining packet portion of said data packet following said certain portion of said certain data, another certain portion of said certain data; and providing, exclusively within said remaining packet portion, a remaining portion of said certain data interleaved within said other data.

2. The method of claim 1 further comprising the steps of:

computing an error correcting code from said certain data of said vocoded speech parameter data; and interleaving said error correcting code within said interleaved remaining portion of said certain data and other data within said data packet.

3. The method of claim 2 wherein said another portion of said certain data comprises data of a second parameter type and data of a third parameter type and wherein said other data comprises data of a third data type and data of a fourth parameter type and wherein said step of providing said remaining portion of said certain data following said certain portions of one of said certain speech parameter data set in said data packet comprises the steps of:

providing said data of said third parameter type immediately following said another portion of one of said certain data set in said data packet; and providing said data of said fourth parameter type immediately following said data of said third parameter type in said data packet.

4. The method of claim 1 wherein said certain portion is of a first parameter type and wherein said another certain portion comprises data of said first parameter type and data of a second parameter type and wherein said step of providing said another certain portion of said certain data comprises the steps of:

providing said data of said first parameter type immediately following said certain portions of certain data in said data packet; and providing said data of said first parameter type immediately following said data of said first parameter type in said data packet.

5. In a vocoding system in which a variable rate linear prediction coding (LPC) vocoder encodes frames of speech samples to produce corresponding sets of encoded speech parameter data based upon an analysis of speech samples in each speech sample frame and predetermined subframes thereof, a method for formatting a frame of one rate parameter data for transmission to reduce the impact of transmission channel induced errors in a transmitted frame of parameter data as received and reconstructed into a corresponding frame of speech samples, said method comprising the steps of:

receiving Line Spectral Pair (LSP) frequency data;

receiving pitch data;

receiving codebook data;

computing a parity check code from certain ones of said LSP frequency data, said pitch data and said codebook data;

assembling in a predetermined sequence within a beginning packet portion of a data packet a first portion of each one of said LSP frequency data;

assembling in a predetermined sequence, other than within beginning packet portion, a second portion of each one of said LSP frequency data, said sequence of second portion of LSP frequency data following said sequence of first portion of said LSP frequency data in said data packet;

providing, other than within said beginning packet portion, a sequence of said pitch data and said codebook data following said sequence of second portion of LSP frequency data in said data packet; and providing said parity check code within said data packet other than within said beginning packet portion.

6. The method of claim 5 further comprising the step of interleaving said parity check code within said data packet following said first portion of each one of said LSP frequency data.

7. The method of claim 6 further comprising the step of interleaving within said data packet a portion of each codebook data within said sequence of second portion of each one of said LSP frequency data and within said sequence of said pitch data and said codebook data, and wherein said parity check codes are interleaved within said sequence of pitch data and codebook data following said interleaved portions of codebook data.

8. The method of claim 5 wherein at said one rate said first plurality of sets of pitch data comprises four sets of pitch data with each set of pitch data comprising pitch lag and pitch gain data, and said first plurality of sets of codebook data comprises eight sets of codebook data with each set of codebook data comprising codebook index and codebook gain data.

9. The method of claim 5 for formatting a frame of another rate parameter data for transmission further comprising the steps:

receiving second Line Spectral Pair (LSP) frequency data;

receiving second pitch data;

receiving second codebook data;

assembling in a predetermined sequence at a beginning of a data packet each one of said LSP data of said second LSP data; and assembling in a predetermined sequence said second pitch data and codebook data following said sequence of LSP data in said data packet.

10. In a vocoding system in which a vocoder produces variable rate frames of parameter data and corresponding frame rate indication, a data packing system for assembling each frame of parameter data into a data packet comprising:

parity check bit computation means for receiving a frame rate indication and predetermined portions of a frame of parameter data, said parity check bit computation means responsive to a highest frame rate indication for computing and providing an output of parity check bit data; and data packing means for receiving said frame rate indication, said frame of parameter data and said parity check bit data said data packing means responsive to said frame rate indication for organizing said frame of parameter data for output according to a predetermined format in a data packet, wherein at said highest frame rate indication said data packing means arranges said data packet such that a sequence of a portion of each parameter data of one parameter data type is provided in a beginning packet portion, and a sequence of a remaining portion of each parameter data of said one parameter data type is provided, exclusively within a remaining packet portion following said beginning packet portion, with remaining parameter data of said frame of parameter data and said parity check bit data.

11. The system of claim 10 wherein said data packing means in response to said highest frame rate indication is further for arranging said data packet with a portion of said remaining parameter data and said parity check bit data interleaved throughout said remaining portion of each parameter data of said one parameter data type and said remaining parameter data.

12. The data packing system of claim 10 wherein said data packing means is responsive to rate indications other than said highest frame rate indication for arranging said data packet beginning with a data sequence of one parameter data type followed by data sequences of remaining parameter data types.

13. The system of claim 10 wherein said data packing means comprises:

frame buffer means for receiving and storing said frame of parameter data, for receiving a first output signal and providing an output of selected parameter data and portions thereof;

packet buffer means for receiving and storing said output of parameter data and portions thereof from said frame buffer and said parity check bit data from said parity check bit computation means, and for providing an output of said selected parameter data and portions thereof as said data packet; and packing means for receiving said rate indication and generating a said first output Signal for controlling the output of data from said first buffer means.

14. In a vocoding system in which received variable data rate frames of vocoded speech parameter data are decoded into corresponding frames of speech samples, a method for reordering said parameter data as formatted in a data packet within each received variable data rate frame wherein parameter data of a highest rate frame contains a portion of each parameter data of one parameter data type in a predetermined order within a beginning packet portion of the data packet, said beginning packet portion being followed by a remaining packet portion within which is exclusively provided another portion of each parameter data of the one set of parameter data in a predetermined order, and followed exclusively within said remaining packet portion by remaining parameter data of said variable data frame, and having parity data within said exclusively within said remaining packet portion, said parity data being computed from parameter data within said data packet, said method comprising the steps of:

receiving a highest rate frame of parameter data;

reassembling corresponding ones of said portion and said another portion of each parameter data of said one parameter data type to provide reassembled data;

computing parity data from parameter data in said received highest rate frame of parameter data;

comparing said computed parity data with said parity data in said received highest rate frame of parameter data; and providing said reassembled data and said remaining parameter data for the reproduction of said speech samples if said computed parity data is the same as said received parity data.

15. The method of claim 14, wherein lower rate frames of parameter data are formatted with parameter data in a data packet in a predetermined order corresponding to the data rate of said variable data rate frame, further comprising the steps of:

receiving an indication of a data rate for each received variable data rate frame of parameter data; and providing parameter data in a predetermined format according to said received variable data rate frame data rate indication.

16. The method of claim 14, wherein said highest rate frame of parameter data further has a portion of each parameter data of another parameter data type interleaved within said another portion of parameter data of said one parameter data type, further comprising the step of reassembling each portion of parameter data of said another parameter data type with a corresponding remaining portion of each of said parameter data of said another parameter data type.

17. The method of claim 14 further comprising the steps of:

receiving a full rate likely indication for said received highest rate frame of parameter data, said full rate likely indicative of at least one error in one of said parameter data and said parity data;

computing parity data from parameter data in said received highest rate frame of parameter data;

comparing said computed parity data with said parity data in said received highest rate frame of parameter data;

detecting from said comparison of said computed parity data with said parity data in said received highest rate frame of parameter data an error in at least one of said parameter data and said parity data in said received highest rate frame of parameter data;

correcting said detected error if occurring in certain ones of said parameter data and said parity data in said received highest rate frame of parameter data;

reassembling corresponding ones of said portions and said another portions of each parameter data of said one set of parameter data; and providing an output of said parameter data when said detected error occurs in said certain ones of said parity data and from corrected parameter data when said detected error occurs in said certain ones of said parameter data.

18. In a vocoding system in which received variable rate frames of data contain vocoded speech parameter data, with the frame data formatted according to a predetermined format, and the parameter data is decoded into corresponding frames of speech samples, a system for reorganizing parameter data within each received variable rate frame of parameter data comprising:

input means for receiving and storing a frame of data, and for providing an ordered sequence of data of said received frame of data in accordance with a control signal; and unpacking means for providing said control signal in accordance with a frame rate indication for said received frame of data.

19. The system of claim 18 wherein a highest rate frame of data contains a portion of each parameter data of one parameter data type in a predetermined order at a beginning of the data packet followed by another portion of each parameter data of said one parameter data type in a predetermined order, followed by remaining parameter data, and having parity data within said data packet computed from parameter data within said data packet, said system further comprising:

parity check means for receiving said parity data in a received highest rate frame of parameter data, computing parity data from parameter data in said received highest rate frame, comparing said computed parity data with said received highest rate frame parity data, and providing an indication when said computed parity data is the same as said received parity data; and wherein said input means is responsive to said control signal and said indication for providing an output of said parameter data comprised of reassembled corresponding ones of said portions and said another portions of each parameter data of said of parameter data type.

20. The system of claim 19 wherein said highest rate frame of parameter data further has a portion of each parameter data of another parameter data type interleaved within said another portion of parameter data of said one parameter data type, said input means further responsive to said control signal for providing an output of each portion of parameter data of said another parameter data type with a corresponding remaining portion of each of said parameter data of said another parameter data type.

21. The system of claim 19 wherein:

said unpacking means and said parity check means further receive a full rate likely indication for said received highest rate frame of parameter data, said full rate likely indicative of at least one error in at least one of said parameter data and said parity data;

said parity check means further for detecting from said comparison of said computed parity data with said parity data in said received highest rate frame of parameter data an error in at least one of said parameter data and said parity data in said received highest rate frame of parameter data, correcting said detected error if occurring in certain ones of said parameter data and said parity data in said received highest rate frame of parameter data; and wherein said input means is responsive to said control signal and said indication for providing an output of said parameter data when said detected error occurs in said certain ones of said parity data, and an output of corrected parameter data when said detected error occurs in said certain ones of said parameter data, and where said output parameter data and corrected parameter data is comprised of reassembled corresponding ones of said portions and said another portions of each parameter data of said one set of parameter data.

22. A method for providing a frame of full rate variable rate vocoder data from received speech samples, said method comprising the following steps of:

generating speech parameter data representative of the received speech samples;

providing, from the speech parameter data, an ordered sequence of most significant line spectral pair (LSP) bits;

providing, from the speech parameter data, an interleaved sequence of less significant LSP bits and certain ones of most significant codebook gain (CBGAIN) bits; and providing, from the speech parameter data, an interleaved sequence of remaining CBGAIN bits, pitch gain (PGAIN) bits, pitch lag (PLAG) bits, codebook index (CBINDEX) bits and parity check bits (PCB).

23. A method for providing a frame of half rate variable rate vocoder data from received speech samples, said method comprising the following ordered steps of:

generating speech parameter data representative of the received speech samples;

providing, from the speech parameter data, an ordered sequence of line spectral pair (LSP) bits; and providing, from the speech parameter data, an ordered sequence of codebook gain (CBGAIN) bits, pitch gain (PGAIN) bits, pitch lag (PLAG) bits and codebook index (CBINDEX).

24. A method for providing a frame of quarter rate variable rate vocoder data from received speech samples, said method comprising the following ordered steps of:

generating speech parameter data representative of the received speech samples;

providing, from the speech parameter data, an ordered sequence of line spectral pair (LSP) bits; and providing, from the speech parameter data, an ordered sequence of codebook gain (CBGAIN) bits, pitch gain (PGAIN) bits, pitch lag (PLAG) bits and codebook index (CBINDEX).

25. A method for providing a frame of eighth rate variable rate vocoder data from received speech samples, said method comprising the following ordered steps of:

generating speech parameter data representative of the received speech samples;

providing, from the speech parameter data, an interleaved sequence of codebook seed (CBSEED) bits and line spectral pair (LSP) bits; and providing, from the speech parameter data, an ordered sequence of codebook gain (CBGAIN) bits.

26. A vocoder comprising:

vocoder engine means for receiving a frame of speech samples and providing speech parameter data representing said frame of speech samples in accordance with a predetermined speech model; and ordering means for receiving said speech parameter data and providing a packet of speech parameter data wherein most perceptually significant portions of said speech parameters are provided in a first part of said packet followed by a second part of said packet within which remaining portions of said speech parameter data are exclusively provided, wherein portions of said remaining portions of speech parameter data are interleaved exclusively throughout said second part of said packet in accordance with at least one predetermined format.

27. The vocoder of claim 26 wherein said vocoder engine means comprises:

means for providing linear predictive code (LPC) data;

means for providing pitch data; and means for providing codebook data.

28. The vocoder of claim 27 further comprising means for converting said LPC data to line spectral pair (LSP) data.

29. The vocoder of claim 28 wherein said ordering means provides said LSP data first in said packet.

30. The vocoder of claim 26 wherein said vocoder engine means provides said parameter data at a selected data rate and provides a data rate signal indicative of said selected data rate and wherein said ordering means is responsive to said data rate signal.

31. In a communication system wherein data from a frame of data is reordered to provide more significant portions of said data in a first half of a transmission packet and wherein remaining portions of said data are provided exclusively in a second half of said transmission packet distinct from said first half of said transmission packet, and wherein portions of said remaining data are interleaved exclusively throughout said second half of said transmission packet, a subsystem for reordering said frame of data comprising:

control means for providing a control signal based upon a frame rate associated with said transmission packet, said control signal being indicative of an unpacking order for said transmission packet; and input means for receiving said transmission packet and providing reordered data from said transmission packet in accordance with said control signal.

32. The subsystem of claim 31 wherein said transmission packet further comprises at least one parity bit, said subsystem further comprising a parity check means for receiving said transmission packet and determining in accordance with a predetermined parity format at least one check bit, comparing said at least one check bit with said at least one parity bit and providing a signal indicative of the equality of said at least one parity bit and said at least one check bit.

33. In a communication system wherein a frame of speech samples is encoded according to a speech model to provide a frame of parameter data and wherein said frame of parameter data is reordered to provide more significant portions of said parameter data in a first half of a transmission packet and wherein remaining portions of said parameter data are provided exclusively in a second half of said transmission packet distinct from said first half of said transmission packet and wherein portions of said remaining data are interleaved exclusively throughout said second half of said transmission packet, a system for providing an estimate of said speech data from said transmission packet comprising:

ordering means for receiving said transmission packet and providing reconstructed estimates of said parameter data from said transmission packet, said reconstructed estimates of said parameter data being ordered in response to a frame rate associated with said transmission packet; and vocoder means for receiving said reconstructed estimates of said parameter data and decoding said reconstructed estimates of said parameter data in accordance with said speech model to provide an estimate of said frame of speech samples.

34. The system of claim 33 wherein said transmission packet comprises parameter data at a selected data rate wherein said selected data rate is selected from a plurality of data rates and wherein said vocoder means is further for decoding said parameter data in accordance with said data rate.

35. In a vocoding system, a method for formatting speech parameter data into a data packet for transmission, said method comprising the steps of:

generating said speech parameter data in response to an input frame of speech samples wherein certain data of said speech parameter data is of greater relative importance than other data of said speech parameter data;

providing a certain portion of said certain data within a beginning packet portion of a data packet, said beginning packet portion of said data packet including exclusively said certain portion of said certain data;

providing interleaved data exclusively in a remaining packet portion of said data packet following said beginning packet portion, said interleaved data being formed by interleaving a remaining portion of said certain data with said other data.

36. The method of claim 35 further comprising the steps of:

computing an error correcting code from said certain data; and interleaving said error correcting code exclusively within said interleaved data.

* * * * *

UNITED STATES PATENT AND TRADEMARK OFFICE
CERTIFICATE OF CORRECTION

PATENT NO. : 5,600,754 Page 1 of 1
DATED : February 4, 1997
INVENTOR(S) : William R. Gardner and Paul E. Jacobs It is certified that error appears in the above-identified patent and that said Letters Patent is hereby corrected as shown below:

Column 3,
Line 34, please delete "be" replace as follows:
-- then converted to a digital signal by codec 14. Codec 14 --

Column 9,
Line 32, please delete "MSB" and replace with -- significant bit -- as follows:
-- code i, $CBGAIN_i$ is the second-most significant bit of CBGAIN --

Column 10,
Line 64, please add a -- d -- after "place" as follows:
-- subframes the codebook index values are placed before the --

Column 12,
Table (III), Bit 28, please delete the "f" in "PFLAG46" and replace with
-- PLAG46: --

Signed and Sealed this

Second Day of August, 2005

JON W. DUDAS
*Director of the United States Patent and Trademark Office*